(12) United States Patent
Wada

(10) Patent No.: US 6,198,151 B1
(45) Date of Patent: Mar. 6, 2001

(54) SEMICONDUCTOR DEVICE, SEMICONDUCTOR INTEGRATED CIRCUIT DEVICE, AND METHOD OF MANUFACTURING SAME

(75) Inventor: Toshio Wada, Tateyama (JP)

(73) Assignee: Nippon Steel Semiconductor Corp. (JP)

( * ) Notice: Subject to any disclaimer, the term of this patent is extended or adjusted under 35 U.S.C. 154(b) by 0 days.

(21) Appl. No.: 09/176,417

(22) Filed: Oct. 21, 1998

(30) Foreign Application Priority Data

Oct. 24, 1997 (JP) .................................. 9-309604
Feb. 17, 1998 (JP) ................................. 10-051536

(51) Int. Cl.$^7$ ..................... H01L 27/108; H01L 29/00
(52) U.S. Cl. ............................. 257/520; 257/301
(58) Field of Search ....................... 257/301, 510, 257/508, 520

(56) References Cited

U.S. PATENT DOCUMENTS

| | | | |
|---|---|---|---|
| 4,278,705 | * 7/1981 | Agraz-Guerena et al. | 257/510 |
| 4,649,625 | * 3/1987 | Lu | 257/301 |
| 4,910,572 | * 3/1990 | Kameyama | 257/508 |
| 5,028,980 | * 7/1991 | Teng | 257/301 |
| 5,329,479 | 7/1994 | Ota et al. | 365/149 |
| 5,895,946 | * 4/1999 | Hamamoto et al. | 257/301 |
| 5,959,319 | * 9/1999 | Iwasa | 257/296 |
| 5,998,822 | * 12/1999 | Wada | 257/301 |

FOREIGN PATENT DOCUMENTS

| | | |
|---|---|---|
| 59-977 | 1/1984 | (JP) . |
| 61-240497 | 10/1986 | (JP) . |
| 62-65295 | 3/1987 | (JP) . |

OTHER PUBLICATIONS

English Translation of Japanese Kokai 61–240497 (10/86).*

* cited by examiner

Primary Examiner—Mark V. Prenty
(74) Attorney, Agent, or Firm—Holland & Hart, LLP

(57) ABSTRACT

It is an object to integrate storing functions at a high density and make it possible to perform a stable operation even at a low power supply voltage. A MOS transistor including a gate electrode and an n-type impurity region serving as a source-drain has a memory capacitor comprised by a dielectric film, a conductor, and an n-type impurity region opposing to the conductor through the dielectric film in a first trench formed in a p-type epitaxial layer beneath the gate electrode. With this structure, an area occupied by the MOS transistor and the memory capacitor can be minimized. Each unit memory cell is a two-transistor memory cell in which the drain and source of a MOS transistor supply a pair of complementary signals to a detection circuit. For this reason, a storing operation can be made reliable, and a stable operation can be realized, especially, at a low voltage.

15 Claims, 12 Drawing Sheets

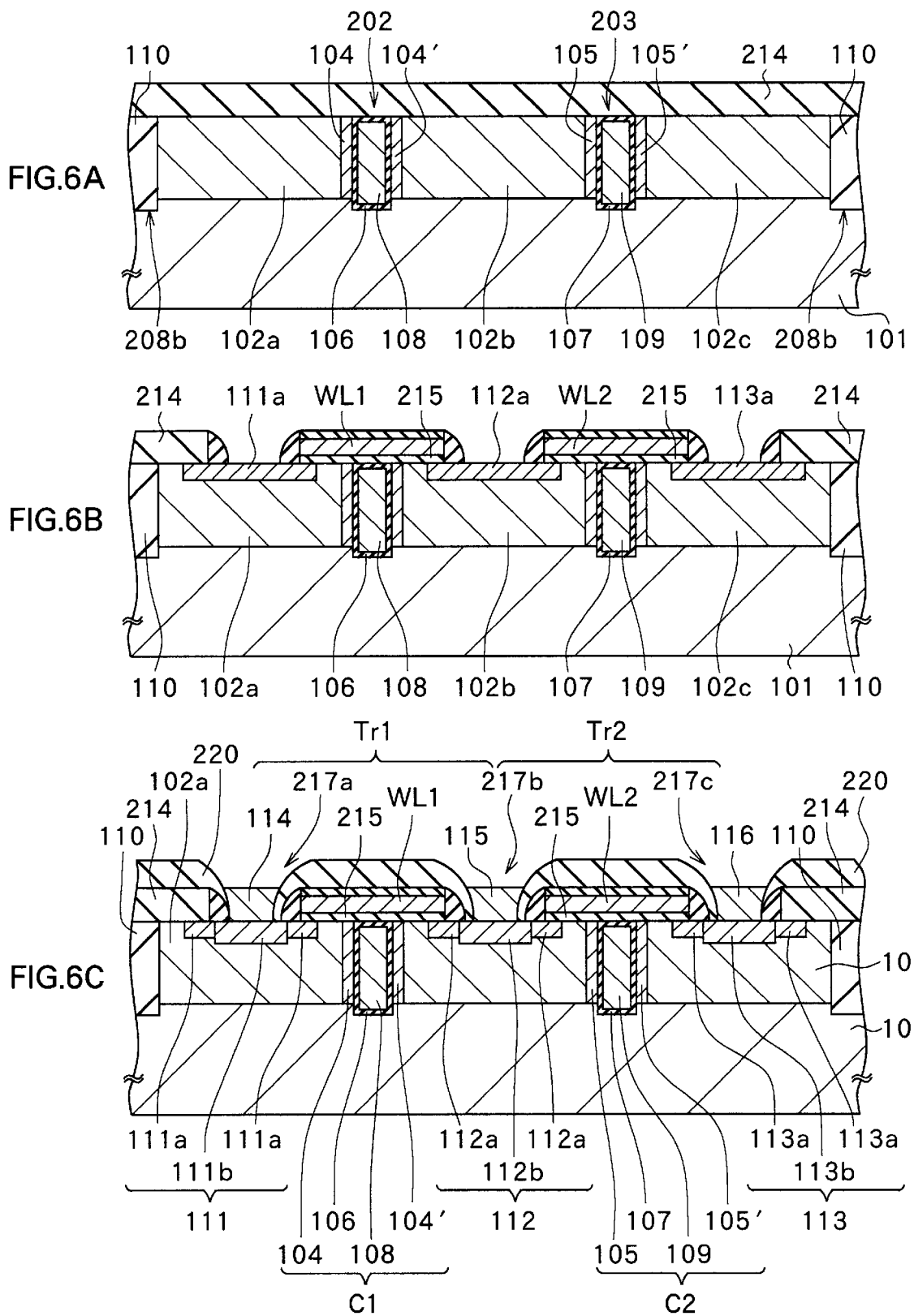

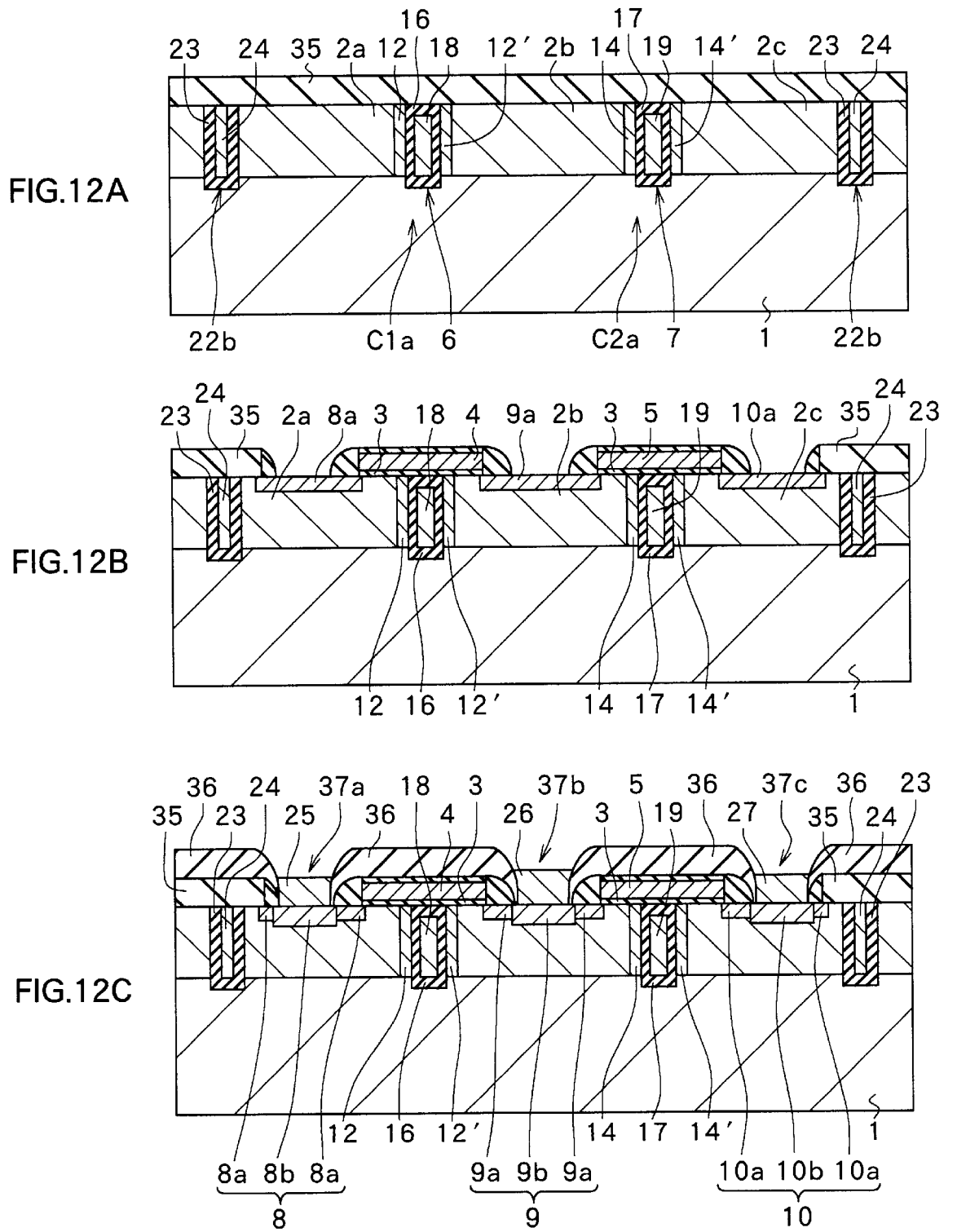

SEMICONDUCTOR DEVICE, SEMICONDUCTOR INTEGRATED CIRCUIT DEVICE, AND METHOD OF MANUFACTURING SAME

BACKGROUND OF THE INVENTION

1. Field of the Invention

The present invention relates to a semiconductor device including a transistor and a capacitor formed on the major surface of a semiconductor substrate, a semiconductor integrated circuit device formed by integrating such semiconductor devices, and a method of manufacturing same.

2. Description of the Related Art

In an integrated circuit formed by integrating memory cells including Metal Oxide Semiconductor (MOS) transistors and capacitors on the major surface of a semiconductor substrate, the integration density can be increased by reducing an area occupied by the capacitors on the major surface of the semiconductor device, so that a large-scale integrated circuit can be realized.

As a capacitor used such a memory cell, a stacked capacitor formed to extend upward from the major surface of a semiconductor substrate, or a trench capacitor formed by forming a trench in the major surface is known. In a memory cell using such a capacitor, a unit memory cell is generally constituted as a one-transistor memory cell including one MOS transistor and one capacitor.

According to the one-transistor memory cell, since the number of functional circuit elements constituting a unit memory cell is small, an area occupied by the unit memory cell is small. For this reason, the number of memory cells per a unit area, i.e., an integration density in a storage element integrated device can be sufficiently increased.

However, in recent years, a power supply voltage tends to decrease with development of micropatterning technique, thereby compressing a signal amplitude. An operation of reliably reading an information signal from a memory cell cannot be easily performed.

For example, in a dynamic random access memory (DRAM), a signal from a memory cell at a read address is transmitted to one of a pair of bit lines, and the other of the pair of bit lines receives a signal from a dummy cell, so that a potential difference between the pair of bit lines is detected as information by using a gated flip-flop as a sensing circuit.

In this sensing operation, in a storage circuit using the one-transistor memory cell, an amount of a setting error of a signal potential of the dummy cell or an amount of a variation in power supply voltage is a part which cannot be used as a dead zone of the power supply potential. For this reason, when the power supply voltage is lowered with development of micropatterning technique, a stable storing operation cannot be performed.

In order to avoid this problem, for example, as described in Japanese Patent Application No. 59-136110 (Japanese Patent Application Laid-Open No. 61-16099), Japanese Patent Application No. 60-81829 (Japanese Patent Application Laid-Open No. 61-240497), Japanese Patent Application No. 60-204087 (Japanese Patent Application Laid-Open No. 62-65295), a two-transistor memory cell structure in which one memory cell includes two transistors and one capacitor to complementarily transmit the same information signal to both of a pair of bit lines is proposed.

However, in the two-transistor memory cell constituted by two MOS transistors and one capacitor, a space occupied by each memory cell increases. For this reason, the two-transistor memory cell structure cannot be easily realized without decreasing an integration density, i.e., a memorizing density. Therefore, an increase in integration density of storage elements and a stable operation performed under the state wherein the power supply voltage is lowered with application of micropatterning technique can not be made compatible.

SUMMARY OF THE INVENTION

The present invention has been made in consideration of the above problem, and has as its object to provide a semiconductor device, semiconductor integrated circuit device, and method of manufacturing same which can be integrated at a high integration density and can be stably operated even if a power supply voltage tends to be lowered.

A semiconductor device according to the present invention comprises: a first conductive film selectively formed above a semiconductor layer and an insulating film is lying between them; a pair of first impurity regions formed in the semiconductor layer beside of the first conductive film; a trench formed in the semiconductor layer beneath the first conductive film; a dielectric film formed to cover the inner surface of the trench; and a second conductive film buried inside the trench having the inner surface covered with the dielectric film.

In this semiconductor device according to the present invention, the trench is formed in the semiconductor layer beneath the first conductive film functioning as a gate electrode that is a constituent element of a MOS transistor, and the dielectric film and the second conductive film as constituent elements of the capacitor are formed in the trench. Since this structure is used, an area occupied by a unit element decreases. For this reason, by applying the semiconductor device of the present invention, a semiconductor integrated circuit having a high density can be realized.

The semiconductor device according the present invention may be applied to the two-transistor memory cells, and the source and drain of the MOS transistors are connected to a pair of information lines (i.e., a pair of bit lines to which complementary information is given), respectively, to supply a complementary signal to a sense circuit. In this case, storing and reading operations are reliably performed, and a stable operation can be performed at a low power supply voltage.

The semiconductor device according to the present invention may comprise a second impurity region formed in the semiconductor layer at side-wall portions on both sides of the trench. The semiconductor layer may comprise a first semiconductor layer of a reverse conductivity type to the conductivity type of the first impurity region, and a second semiconductor layer formed on the first semiconductor layer, and the trench is formed in the second semiconductor layer such that the bottom portion of the trench reaches the first semiconductor layer. The first semiconductor layer may comprise a monocrystalline silicon substrate containing a higher-concentration impurity of one conductivity type, and the second semiconductor layer may comprise a silicon epitaxial layer containing a lower-concentration impurity of the one conductivity type. The dielectric film may comprise a nitride film, or may comprise a three-layered structure including an oxide film, a nitride film, and an another oxide film, or may comprise a ferroelectric film. The second conductive film may comprise a polycrystalline silicon film containing an impurity.

A semiconductor integrated circuit device according to the present invention comprises: a plurality of semiconductor layers of one conductivity type formed on one major surface of a substrate to be insulated from each other; a MOS transistor formed on the semiconductor layer; and a memory capacitor formed by using a first trench formed in the semiconductor layer beneath a gate electrode of the MOS transistor.

In this semiconductor integrated circuit device, the upper end of the first trench may oppose the gate electrode of the MOS transistor through an insulating film, and the lower end of the first trench may reach the substrate. The memory capacitor may comprise a dielectric film formed inside the first trench, and a conductor surrounded with the dielectric film and held at a floating potential. The memory capacitor may further comprise a conductive region which is formed at both side-wall portions of the first trench through the dielectric film to be capacitively coupled with the conductor. In this case, the conductive region may be formed by doping an impurity of a reverse conductivity type to the conductivity type of the semiconductor layer into the semiconductor layer. The semiconductor layers may be formed almost parallel to each other in one direction to be insulated from each other on the substrate, and the MOS transistors and the memory capacitors may be formed to be aligned in the semiconductor layer. The semiconductor layers can be insulated from each other by second trenches dug from the surfaces of the semiconductor layers toward the substrate. Here, the second trench may have such a depth that the second trench reaches the substrate from the surface of the semiconductor layer. An insulator may be buried in the second trench. The second insulating film may be formed to cover the inner surface of the second trench, and the second conductor may be buried inside the second trench having an inner surface covered with the second insulating film.

Another semiconductor integrated circuit device according to the present invention comprises: a semiconductor layer, a first trench formed in the semiconductor layer to extend in a first direction; a second trench formed in the semiconductor layer to extend in a second direction; a charge accumulation memory capacitor formed to comprise a dielectric film formed to cover the inner surface of the first trench and a first electrode layer buried inside the first trench having the inner surface covered with the dielectric film to be opposed to the semiconductor layer through the dielectric film at a side-wall portion of the first trench; an element separation field shield structure, for dividing the memory capacitors and the semiconductor layers into a plurality of blocks, formed to comprise an insulating film formed to cover the inner surface of the second trench and a second electrode layer buried inside the second trench having the inner surface covered with the insulating film; and a transistor for controlling an operation of inputting/outputting charges into/from the memory capacitor located beneath the transistor, formed to comprise a gate structure formed above the memory capacitor in a divided block and a pair of first impurity regions formed in the semiconductor layer on both sides of the gate structure.

A method of manufacturing a semiconductor integrated circuit device according to the present invention comprises: the first step of forming a plurality of first trenches extending in a first direction in a semiconductor layer; the second step of forming a dielectric film to cover the inner surface of the first trench; the third step of burying a first conductive film inside the first trench having an inner surface covered with the dielectric film; the fourth step of forming a plurality of second trenches extending in a second direction in the semiconductor layer to separate the dielectric film and the first conductive film formed in the first trench; the fifth step of forming a first insulating film on the surface of the semiconductor layer divided by the second trenches; the sixth step of forming a second conductive film on the first insulating film; the seventh step of patterning the second conductive film and the first insulating film to form a gate structure comprising the first insulating film and the second conductive film over the first trench; and the eighth step of forming a pair of impurity regions in a surface region of the semiconductor layer on both sides of the gate structure.

Other and further objects, features and advantages of the invention will appear more fully from the following descripion.

BRIEF DESCRIPTION OF THE DRAWINGS

FIG. 6A is a sectional view showing the manufacturing step subsequent to FIGS. 5A and 5B.

FIG. 6B is a sectional view showing the manufacturing step subsequent to FIG. 6A.

FIG. 6C is a sectional view showing the manufacturing step subsequent to FIG. 6B.

FIG. 12A is a sectional view showing the manufacturing step subsequent to FIGS. 11A and 11B.

FIG. 12B is a sectional view showing the manufacturing step subsequent to FIG. 12A.

FIG. 12C is a sectional view showing the manufacturing step subsequent to FIG. 12B.

DETAILED DESCRIPTION OF THE PREFERRED EMBODIMENTS

[First Embodiment]

Figure 1:
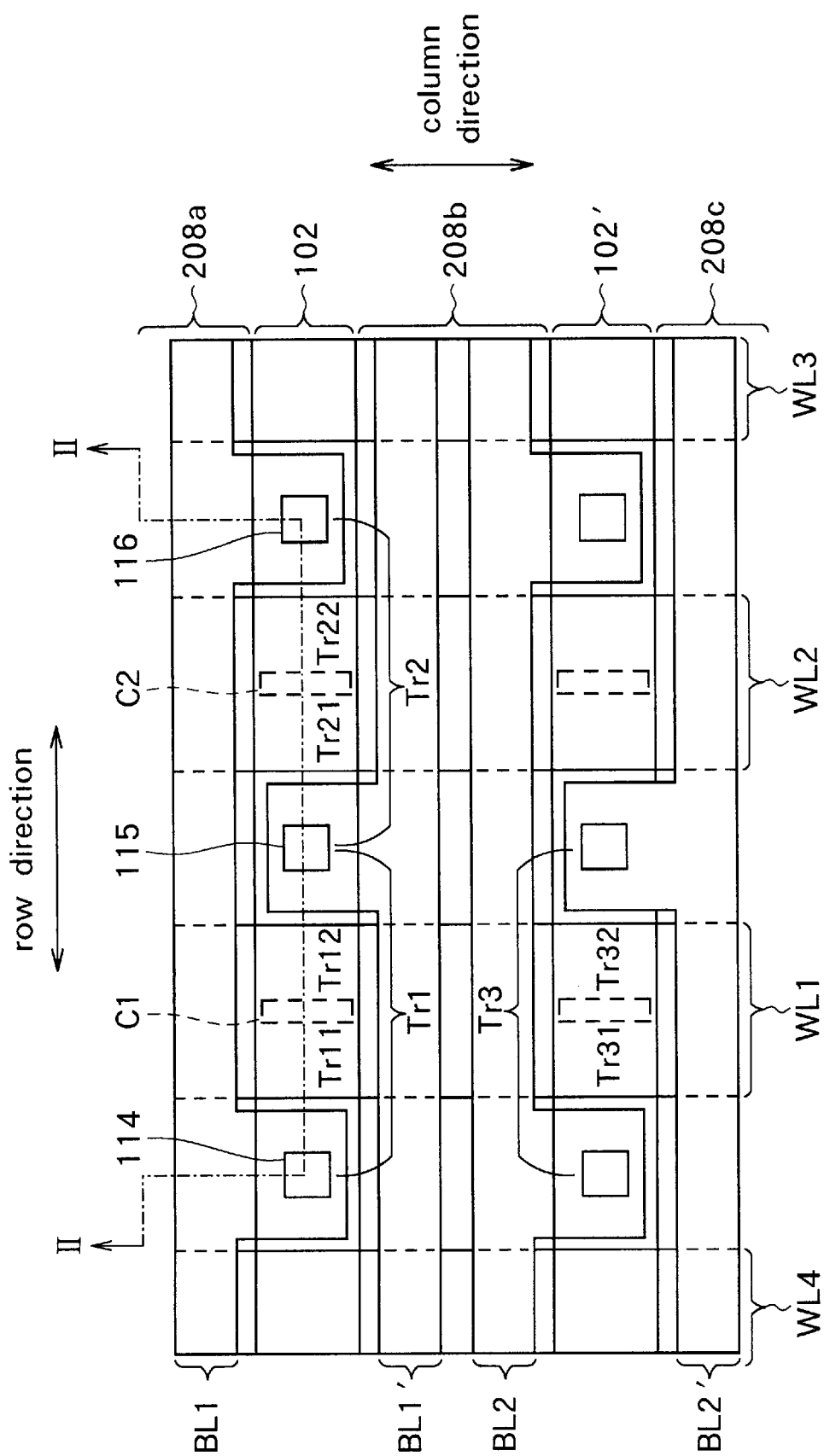
FIG. 1 is a plan view showing the structure of a memory cell array of a DRAM according to the first embodiment of the present invention.

In the first embodiment, a DRAM is illustrated as a semiconductor integrated circuit. The arrangement of the memory cells of the DRAM and a method of manufacturing the DRAM will be described below. FIG. 1 shows an outline of a planar structure of the memory cells of the DRAM, FIG. 2 shows a II—II section in FIG. 1, and FIG. 3 shows an equivalent circuit of the memory cell.

The arrangement of a DRAM according to this embodiment will be described below. As shown in FIGS. 1 to 3, the DRAM is a MOS memory integrated circuit, and comprises word lines WL1, WL2, WL3, and WL4 extending in a column direction and made of a conductive polycrystalline silicon film containing phosphorous, for example, bit lines BL1, BL1', BL2, and BL2' extending in a row direction, and memory cells arranged at cross points between the word lines and the bit lines. Here, in FIG. 1 and FIG. 3, the column direction means a vertical direction, and the row direction means a horizontal direction. As shown in FIGS. 2 and 3, one memory cell comprises a transistor Tr1 having two MOS transistors Tr11 and Tr12 serving as access transistors and a MOS capacitor C1. The bit lines BL1 and BL1' are a pair of bit lines for transmitting a pair of complementary signals representing the same information and connected to the drain and source of a MOS transistor Tr1, and to the drain and source of MOS transistor Tr2, respectively. Similarly, the bit lines BL2 and BL2' are a pair of bit lines for transmitting a pair of complementary signals representing the same information and connected to the drain and source of a MOS transistor Tr3. Here, the pair of complementary signals representing the same information means a pair of signals having logical levels which are reverse to each other.

Figure 2:
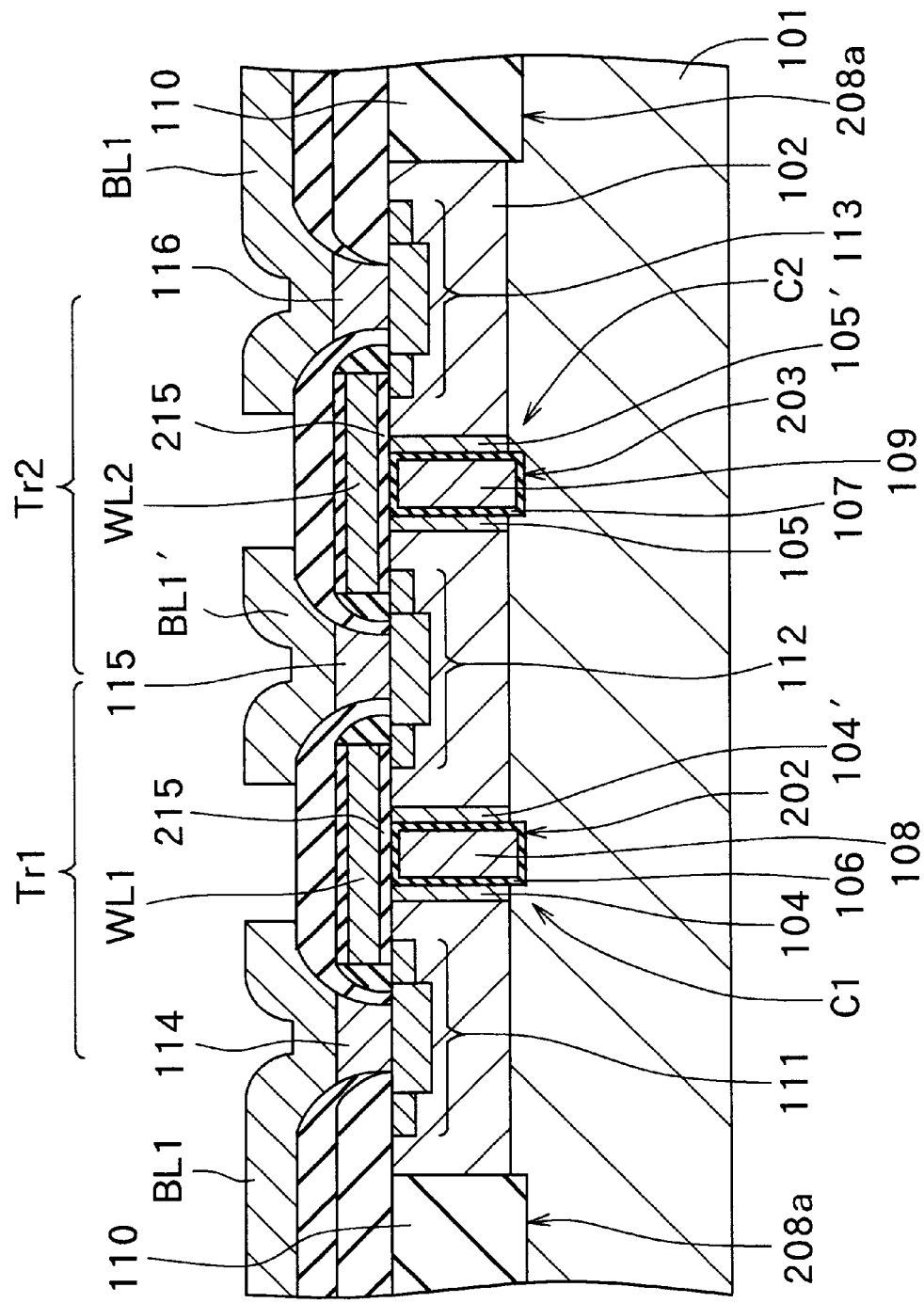
FIG. 2 is a sectional view showing the sectional structure of a main part of the memory cell array of the DRAM shown in FIG. 1.
Figure 3:
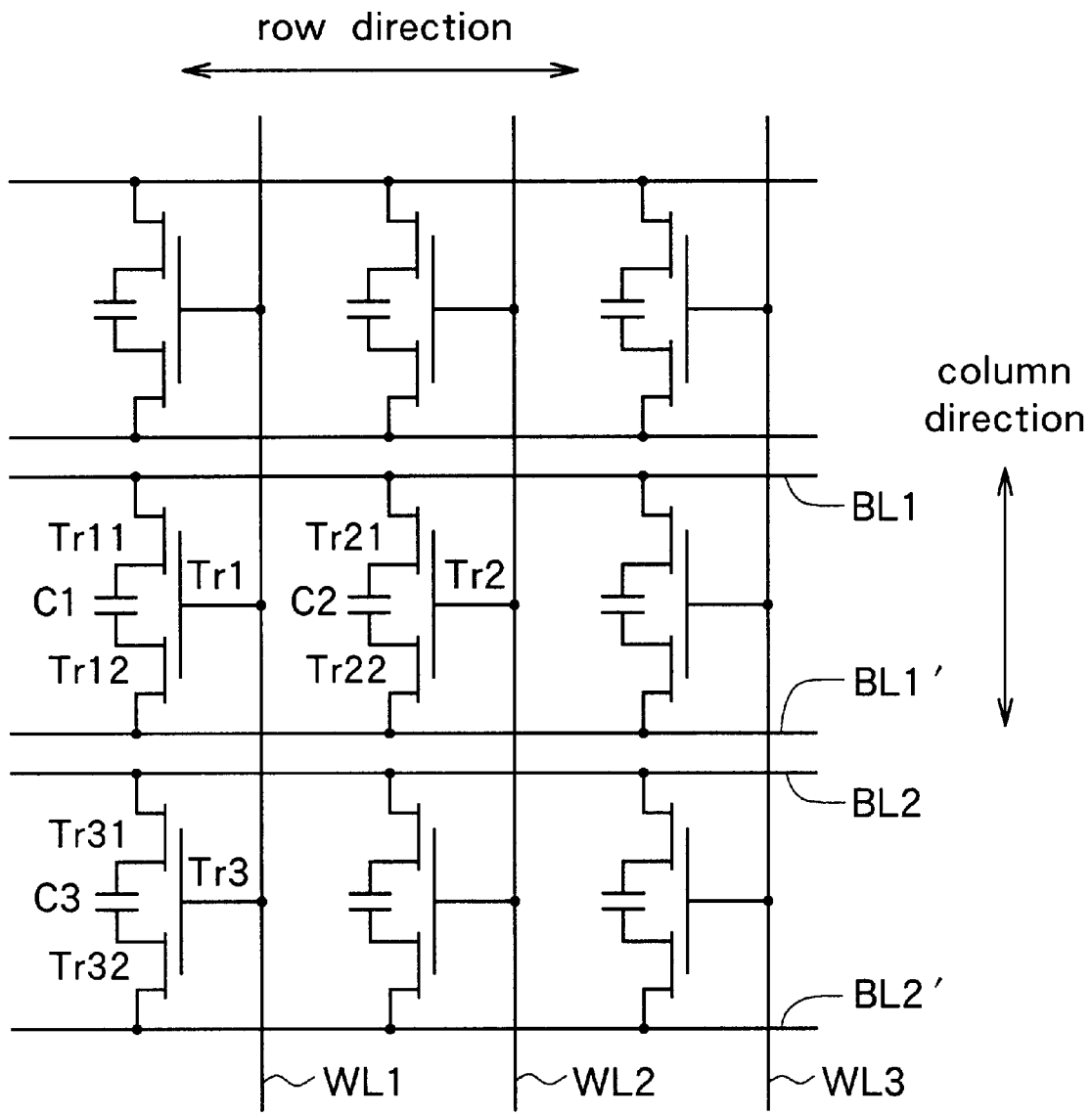
FIG. 3 is an equivalent circuit diagram of the memory cell array of the DRAM shown in FIG. 1.

As shown in FIGS. 1 and 2, the DRAM comprises a substrate 101 made of p-type silicon monocrystal containing boron at a high concentration and having a resistivity of 0.010 to 0.050 Ω-cm and epitaxial layers 102 and 102' extending in the row direction on one major surface of the substrate 101 and having a resistivity of 1 to 10 Ω-cm and a thickness of 3 to 10 μm. First trenches 202 and 203 are formed in the epitaxial layers 102 and 102' beneath the central portions of the word lines WL1 and WL2 in width direction, respectively. Each of the first trenches 202 and 203 has a width of 0.1 to 0.3 μm and a depth equal to or larger than the thicknesses of the epitaxial layers 102 and 102'. Memory capacitors (MOS capacitors) C1 and C2 are formed to be buried in the first trenches 202 and 203, respectively.

The MOS capacitor C1 comprises, as will be described later, n-type regions 104 and 104' formed by diffusing an impurity from the inner wall surface of the first trench 202 into the epitaxial layer 102, a dielectric film 106 adhered to the inner surface of the first trench 202, and a conductor 108 buried in a residual space in the first trench 202 after the dielectric film 106 is formed. Similarly, the MOS capacitor C2 comprises, as will be described later, n-type regions 105 and 105' formed by diffusing an impurity from the inner wall surface of the first trench 203, a dielectric film 107 adhered to the inner surface of the first trench 203, and a conductor 109 buried in a residual space in the first trench 203 after the dielectric film 107 is formed. The conductors 108 and 109 are formed by using polycrystalline silicon containing phosphorus (P), e.g. In this arrangement, MOS capacitors are formed between the conductor 108 and the n-type regions 104 and 104' on both the sides of the first trench 202, respectively, and MOS capacitors are formed between the conductor 109 and the n-type regions 105 and 105' on both sides of the first trench 203.

Each of the dielectric films 106 and 107 is a so-called ONO film configured by a three-layered structure comprising a silicon oxide film, a silicon nitride film, and a silicon oxide film used in a DRAM disclosed in, e.g., Japanese Publication of Examined applications No. 59-977 (Japanese Patent Application No. 51-11991). The film thickness of the ONO film is controlled to a converted thickness of about 30 to 120 angstroms (Å) obtained if only silicon oxide film was used. In the boundary between the epitaxial layers 102 and 102', second trenches 208a, 208b, 208c, . . . are formed. The second trenches 208a, 208b, 208c, . . . are filled with an insulator 110 containing a silicon oxide as a main component. The second trenches 208a, 208b, 208c, . . . filled with the insulator 110 perform as an insulating separation band in the row direction.

Thin insulating films formed together with the formation of gate insulating films 215 and 216 are present between the conductor 108 of the MOS capacitor C1 and the word line WL1 serving as the gate electrode of the MOS transistor Tr1 and between the conductor 109 and the word line WL2 serving as the gate electrode of the transistor Tr2, respectively. The thin insulating films respectively surround the conductors 108 and 109 together with the dielectric films 106 and 107 of the MOS capacitors and the insulating separation insulator 110. In this manner, the conductors 108 and 109 serve as floating electrodes electrically insulated from an external circuit. Practically, the MOS capacitor C1 of the MOS transistor Tr1 has, as an opposing electrode, the n-type regions 104 and 104' located immediately under the word line WL1 serving as the gate electrode of the MOS transistor Tr1, and has the conductor 108 as an intermediate electrode serving as a floating electrode. Similarly, the MOS capacitor C2 of the MOS transistor Tr2 has, as an opposing electrode, the n-type regions 105 and 105' located immediately under the word line WL2, and has the conductor 109 as an intermediate electrode serving as a floating electrode.

The drain and source of the MOS transistor Tr1 are n-type regions 111 and 112 formed by doping near the surfaces of the p-type epitaxial layers 102 on both the sides of the word line WL1 serving as the gate electrode of the MOS transistor Tr1, respectively. The drain and source of the MOS transistor Tr2 are n-type regions 112 and 113 formed by doping near the surfaces of p-type epitaxial layers 102 on both the sides of the word line WL2 serving as the gate electrode of the MOS transistor Tr2. These n-type regions 111, 112, and 113 are conductively connected to the pair of bit lines BL1 and BL1' extending in the row direction through contact plugs 114, 115, and 116 made of titanium-silicide alloy, titanium nitride, or the like.

Figure 4A:
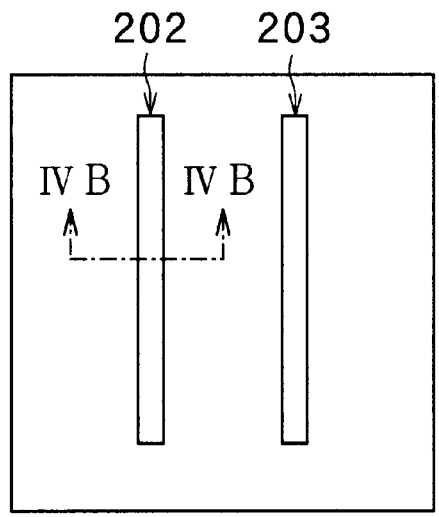
FIG. 4A is a plan view showing a step of manufacturing a DRAM according to the first embodiment of the present invention.
Figure 4B:
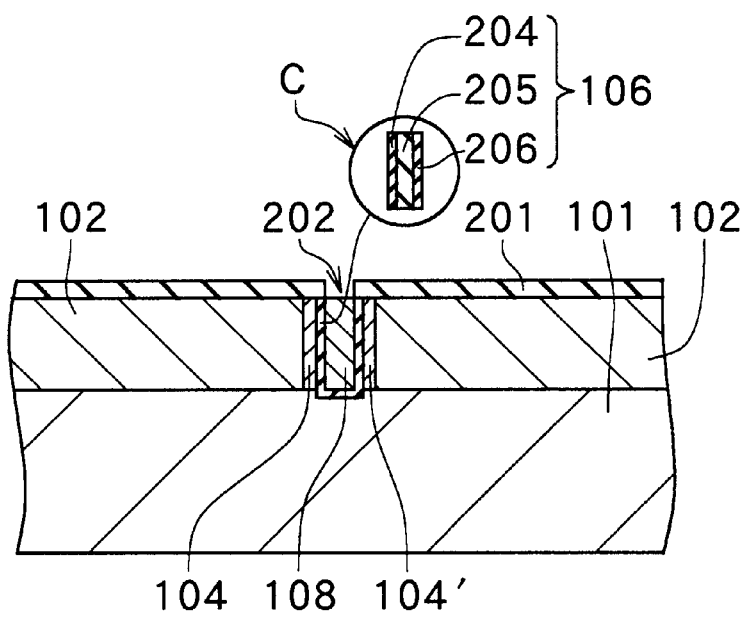
FIG. 4B is a sectional view showing a step of manufacturing a DRAM according to the first embodiment of the present invention.
Figure 5A:
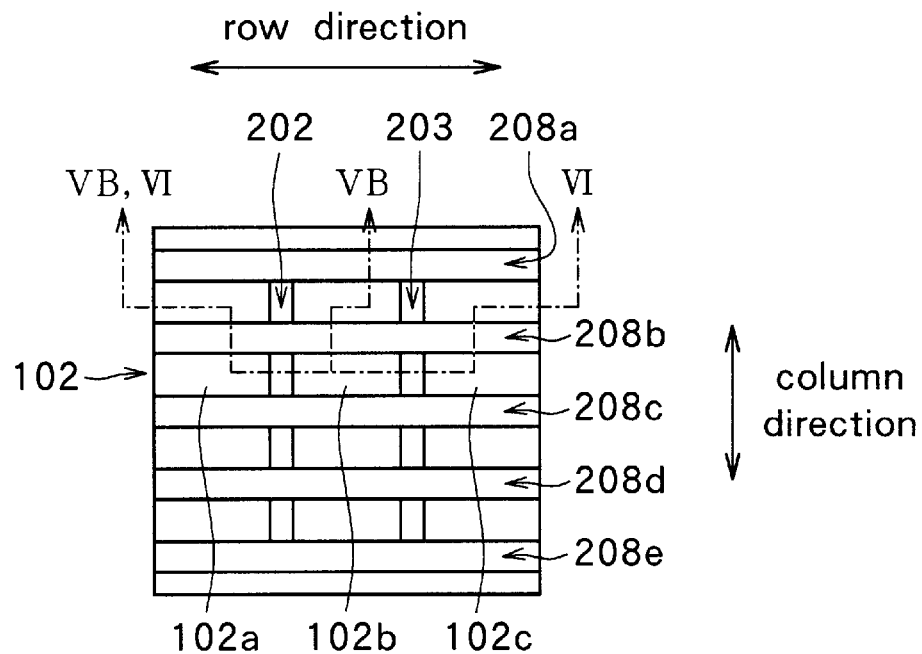
FIG. 5A is a plan view showing the manufacturing step subsequent to FIGS. 4A and 4B.
Figure 5B:
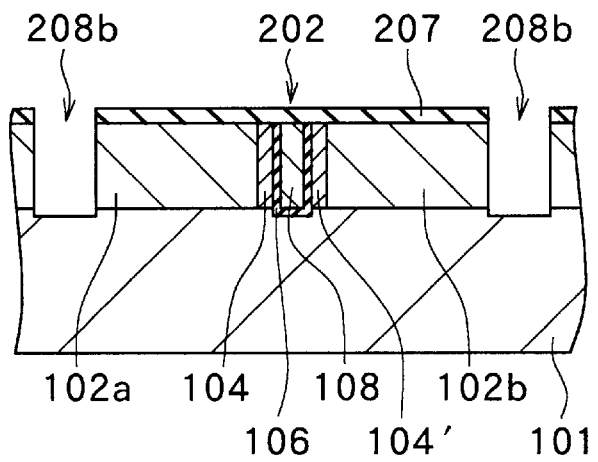
FIG. 5B is a sectional view showing the manufacturing step subsequent to FIGS. 4A and 4B.

A method of manufacturing a DRAM shown in FIGS. 1 to 3 will be described below with reference to FIGS. 4A to 6C. Here, FIGS. 4A to 6C are views for explaining a method of manufacturing a DRAM. More specifically, FIG. 4A is a plan view in a manufacturing step, FIG. 4B shows an IVB—IVB section in FIG. 4A, FIG. 5A is a plan view in the step subsequent to FIGS. 4A and 4B, and FIG. 5B shows a VB—VB section in FIG. 5A. FIGS. 6A to 6C are sectional views showing the steps subsequent to FIGS. 5A and 5B.

First, as shown in FIGS. 4A and 4B, the low-concentration p-type epitaxial layer 102 is formed on one major surface of the high-concentration p-type monocrystalline silicon substrate 101. A silicon oxide film 201 is selectively formed on the surface of the epitaxial layer 102 by thermal oxidation. The epitaxial layer 102 is selectively etched by using the silicon oxide film 201 as a mask to form first trenches 202 and 203 extending in a column direction. The first trenches 202 and 203 have such depth that the first trenches 202 and 203 reach the high-concentration substrate 101 though the epitaxial layer 102 having a thickness of 3 to 16 μm, and the width of the first trenches 202 and 203 is set to be 0.1 to 0.35 μm.

An n-type impurity such as phosphorus or arsenic (As) is doped from the inner wall surfaces of the first trenches 202 and 203 into the epitaxial layer 102 by diffusion to form the n-type regions 104 and 104' and the n-type regions 105 and 105' in the epitaxial layer 102, respectively. Here, the bottom surfaces of the first trenches 202 and 203 reach the substrate 101. However, since the substrate 101 contains a high-concentration p-type impurity, the n-type impurity doped from the inner wall surfaces of the first trenches 202 and 203 does not invert the substrate concentration of the substrate 101. For this reason, regions for forming the n-type regions 104, 104' and 105, 105' do not reach the inside of the substrate 101 and are limited within the p-type epitaxial layer 102. More specifically, the n-type regions 104, 104' and 105, 105' are terminated where the regions reach the substrate 101. Subsequently, the thin dielectric films 106 and 107 each having a thickness of about 30 to 120 Å are formed on the inner surfaces of the first trenches 202 and 203, respectively, and the conductors 108 and 109 consisting of polycrystalline silicon films or the like containing phosphorus, e.g., are buried in residual spaces in the first trenches 202 and 203. Each of the dielectric films 106 and 107, as shown in the enlarged view in a circle C in FIG. 4B, is a three-layered structure made of a silicon oxide film 204, a silicon nitride film 205, and a silicon oxide film 206, for example.

As shown in FIGS. 5A and 5B, a silicon oxide film 207 serving as an etching mask is formed on the epitaxial layer 102 and the buried first trenches 202 and 203 by thermal oxidation and a photolithography process and the subsequent dry etching process is performed, thereby forming second trenches 208a to 208e extending in a row direction. In FIG. 5A, the silicon oxide film 207 is omitted. The depth of the second trenches 208a to 208e is larger than that of the first trenches 202 and 203. Therefore, the first trenches 202 and 203 are completely divided by the second trenches 208a to 208e. At this time, the n-type regions 104 and 104', the dielectric film 106, the conductor 108, and the epitaxial layer 102 are divided in the column direction. In this manner, the MOS capacitor C1 having a structure in which the n-type regions 104 and 104' on both sides of the first trench 202 oppose to the conductor 108 serving as a floating electrode through the dielectric 106 and the memory capacitor C2 having a structure in which the n-type regions 105 and 105' on both sides of the first trench 203 oppose to the conductor 109 serving as a floating electrode through the dielectric 107 are formed. The p-type epitaxial layer 102a comprising the n-type region 104, a p-type epitaxial layer 102b comprising the n-type regions 104' and 105, and a p-type epitaxial layer 102c comprising the n-type region 105' are independent of each other by forming the first trenches 202 and 203 and the second trenches 208a to 208e.

As shown in FIG. 6A, the second trenches 208a to 208e are buried with the insulator 110 containing a silicon oxide as a main component to realize insulating separation in the column direction. Separation of the p-type epitaxial layers 102a to 102c in the row direction has been performed by the first trenches 202 and 203 buried with the conductors 108 and 109 and the like. Subsequently, a silicon oxide film 214 is coated on the p-type epitaxial layers 102a to 102c and the first trenches 202 and 203 to prepare the following steps.

As shown in FIG. 6B, the silicon oxide film 214 on the surface of the p-type epitaxial layers 102a to 102c is selectively removed, and a thermal oxidation process is performed to form a gate insulating film 215. A polycrystalline silicon film containing phosphorus and a tungsten-silicon film are sequentially formed on the gate insulating film 215, then a photolithography process and the subsequent dry etching process are performed to these films to selectively form the word lines WL1 and WL2. At this time, the word lines WL1 and WL2 are formed immediately above the conductors 108 and 109 to extend in a column direction. In this manner, the MOS capacitor C1 is located beneath the central portion of the multi-layered portion of the gate insulating film 215 and the word line WL1 in a width direction (row direction), and the MOS capacitor C2 is located beneath the central portion of the multi-layered portion of the gate insulating film 215 and the word line WL2 in a width direction.

Subsequently, a cap layer serving as a protective layer is formed on the word lines WL1 and WL2, and insulating film side-walls are formed on the side surface of the multi-layered structure comprising the gate insulating film 215, the word line WL1 and the cap layer and the side surface of the multi-layered structure including the gate insulating film 215, the word line WL2 and the cap layer. In addition, an n-type impurity is doped in a portion near the surface of the p-type epitaxial layers 102a to 102c on both sides of the multi-layered portions comprising the word lines WL1 and WL2 by using the word lines WL1 and WL2, the insulating film side-walls, and the silicon oxide film 214 as masks to form n-type regions 111a, 112a, and 113a.

As shown in FIG. 6C, an insulating film 220 consisting of, e.g., boron silicate glass is formed on the entire surface of the resultant structure, and contact holes 217a, 217b, and 217c respectively reaching the surfaces of the n-type regions 11a, 112a, and 113a are formed. A high-concentration n-type impurity is doped through these contact holes 217a, 217b, and 217c into the n-type regions 11a, 112a, and 113a, respectively, to form higher-concentration n-type regions 111b, 112b, and 113b, and final n-type regions 111, 112, and 113 for an LDD (Lightly Doped Drain) structure are formed. Titanium (Ti), titanium nitride (TiN), and tungsten (W) are sequentially selectively formed on the n-type regions 111, 112 and 113 to form the contact plugs 114, 115, and 116 to be conductively connected to the bit lines BL1 and BL2. In this manner, formation of the MOS transistor Tr1 in which the n-type regions 111 and 112 serve as a drain-source region and the word line WL1 serves as a gate electrode, and formation of the MOS transistor Tr2 in which the n-type regions 112 and 113 serve as a drain-source region and the word line WL2 serves as a gate electrode are completed. The MOS capacitors C1 and C2 dividing channels are formed under the MOS transistors Tr1 and Tr2, respectively.

As shown in FIG. 2, the bit lines BL1 and BL1' conductively connected to the contact plugs 114, 115, and 116 are formed, and the step of forming an insulating interlayer and a via hole (not shown) is performed, thereby completing the memory cell array of a DRAM.

As described above, the MOS transistor Tr1 equivalently comprises the transistor Tr11 in which the word line WL1 serves as a gate electrode and the n-type regions 111 and 104 serve as a drain/source region and a transistor Tr12 in which the word line WL1 serves as a gate electrode and the n-type regions 104' and 112 serve as a drain/source region. The MOS capacitor C1 is arranged between the n-type regions 104 and 104' of these transistors. More specifically, the MOS transistor Tr1 and the MOS capacitor C1 are vertically arranged to overlap. For this reason, a memory cells which occupies a small area can be arranged. In addition, the drain and source of the MOS transistor of the memory cell are designed to supply a pair of complementary signals having logical levels which are reverse to each other to each of the pair of bit lines, respectively. A stable operation can be performed even at a low power supply voltage.

[Second Embodiment]

The second embodiment of the present invention will be described below.

Figure 7:
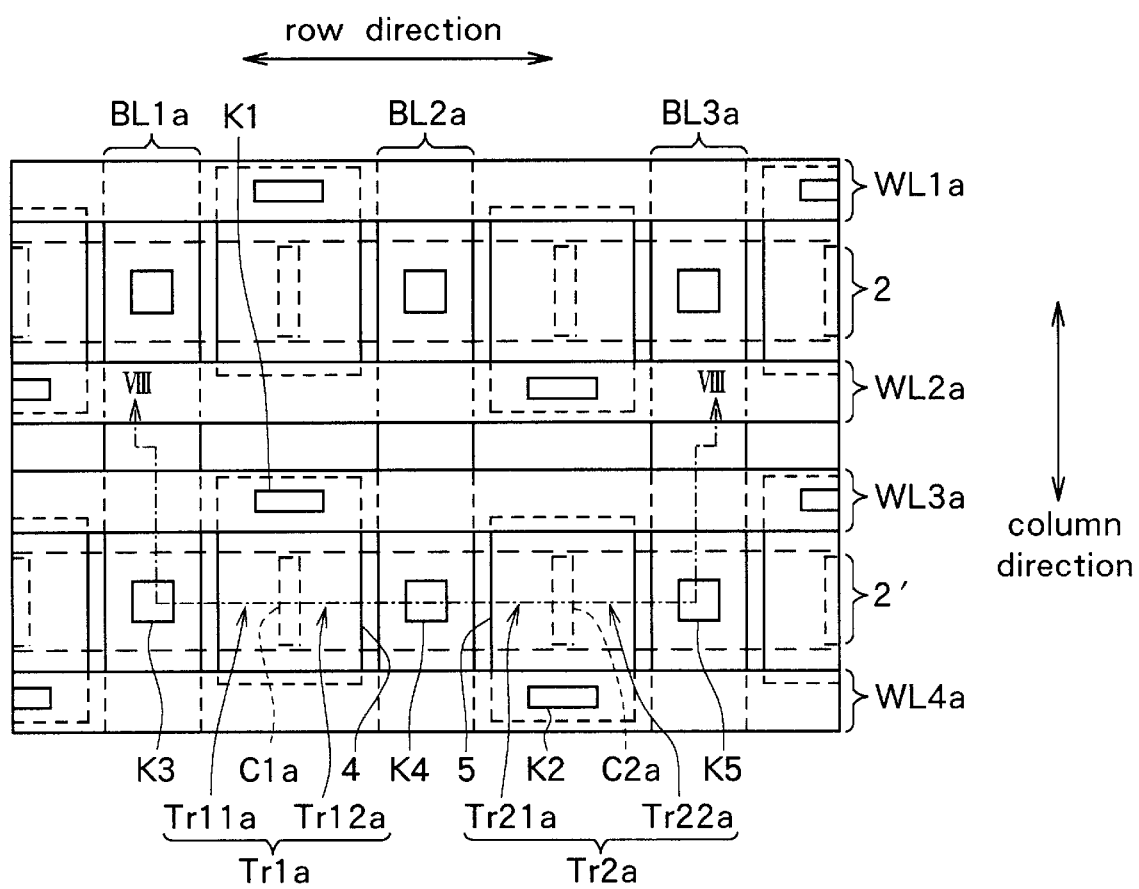
FIG. 7 is a plan view showing the structure of a memory cell array of a DRAM according to the second embodiment of the present invention.
Figure 8:
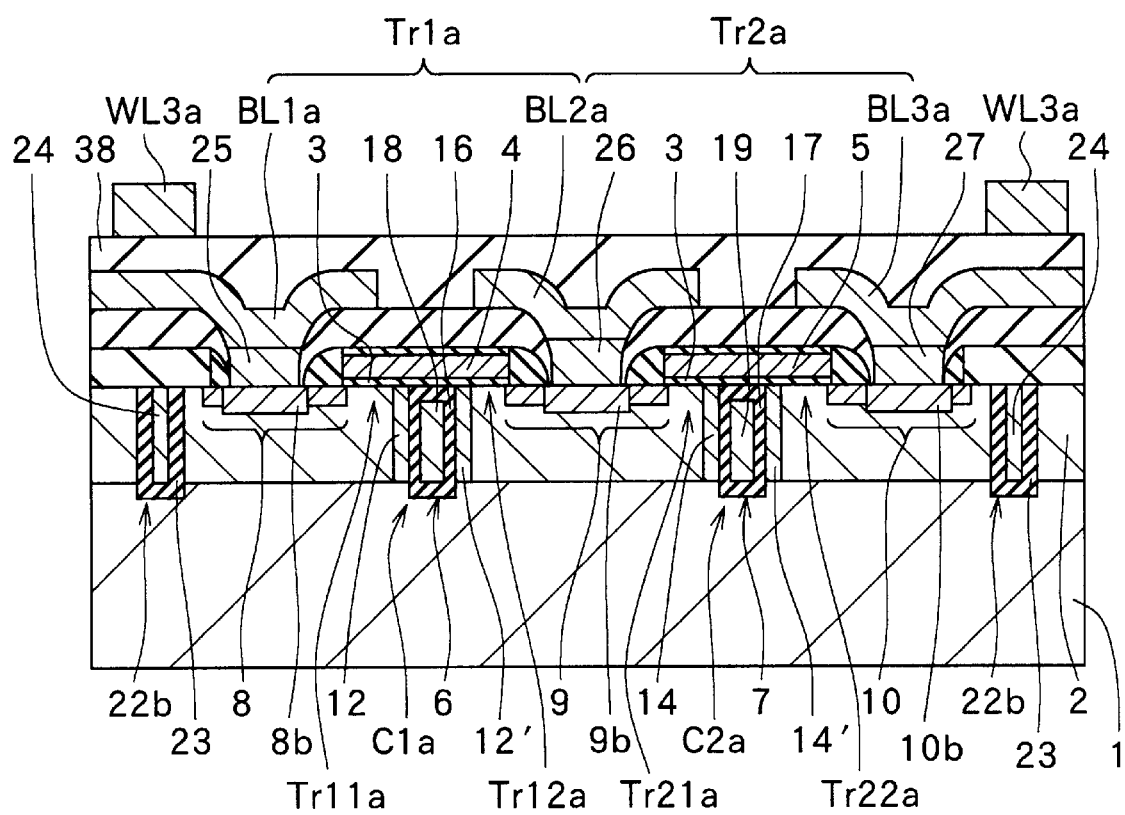
FIG. 8 is a sectional view showing the sectional structure of a main part of the memory cell array of the DRAM shown in FIG. 7.
Figure 9:
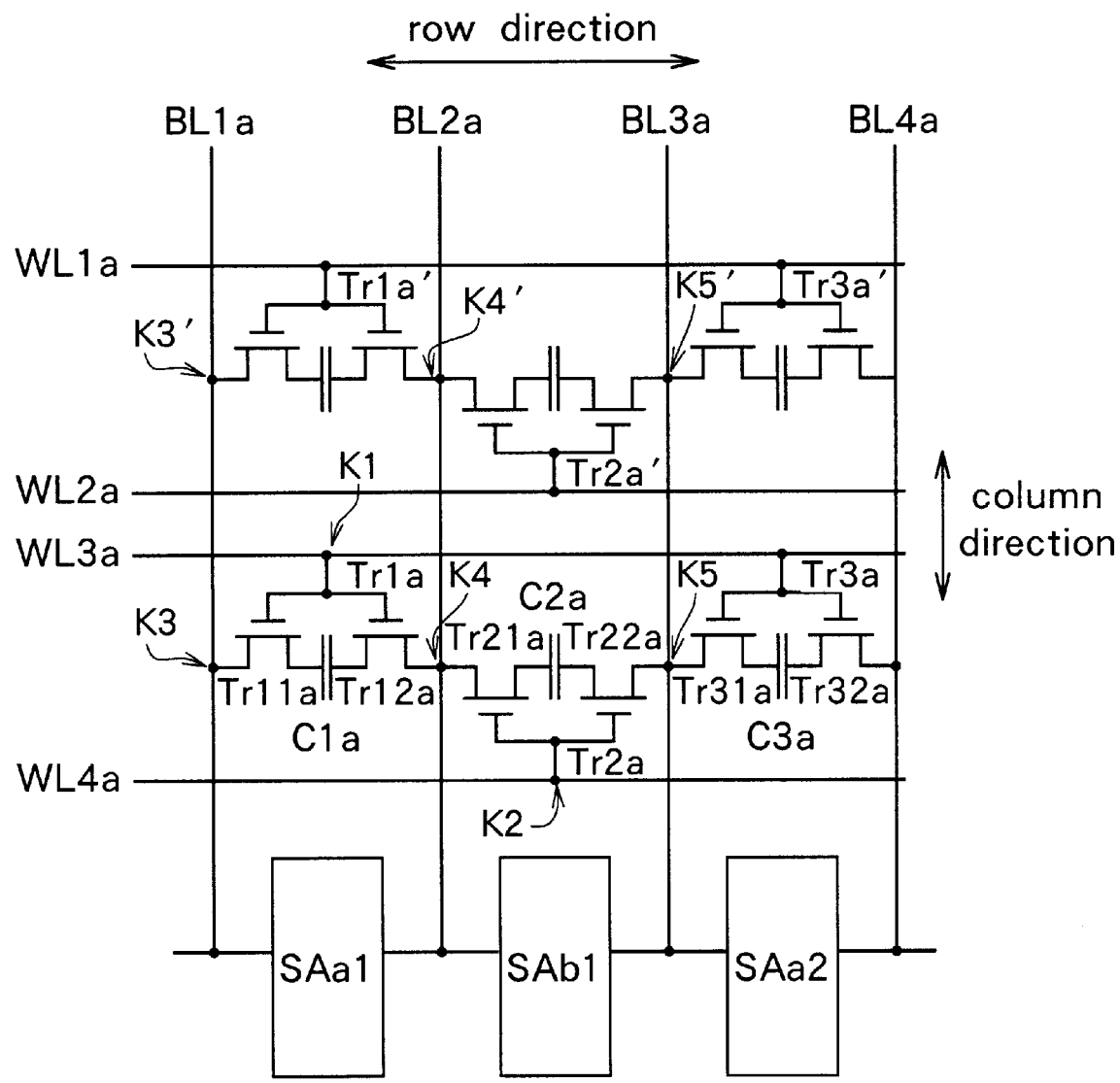
FIG. 9 is an equivalent circuit diagram of the memory cell array of the DRAM shown in FIG. 7.

FIGS. 7 to 9 show a DRAM serving as a semiconductor device according to the second embodiment of the present invention. Here, FIG. 7 shows a planar structure of the DRAM, FIG. 8 shows a VIII—VIII section in FIG. 7, and FIG. 9 shows an equivalent circuit of the DRAM.

The DRAM according to this embodiment is compared with the DRAM according to the first embodiment. Although the sectional structure of the memory cell of the second embodiment is the same as that of the first embodiment, the planar arrangement pattern of the memory cell of the second embodiment is different from that of the first embodiment. More specifically, by a change in forming pattern on and subsequent to the gate electrode forming step, the wiring directions of word lines WL1a, WL2a, WL3a, and WL4a and bit lines BL1a, BL2a, and BL3a are changed. More specifically, the bit lines BL1a, BL2a, and BL3a extend in the column direction and serve as common bit lines for memory cells being adjacent in the column direction.

For example, in FIGS. 7 and 9, when attention is given to a MOS transistor Tr2a, a contact K4 to the bit line BL2a is shared by one of the drain and source of the transistor Tr2a and the MOS transistor Tr1a on the left of the MOS transistor Tr2a in the drawings, and a contact K5 to the bit line BL3a is shared by another of the drain and source of the MOS transistor Tr2a and the MOS transistor Tr3a on the right of the MOS transistor Tr2a. Similarly, a contact K4' to the bit line BL2a is shared by a MOS transistor Tr2a' belonging to the same column as that of the MOS transistor Tr2a and a MOS transistor Tr1a' on the left of the MOS transistor Tr2a'. A contact K5 to the bit line BL3a is shared by the MOS transistor Tr2a' and a MOS transistor Tr3a'.

Gate electrodes 4 and 5 of each memory cell are independently formed for each memory cell, and are conductively connected to the word lines WL3a and WL4a extending in a row direction through contacts K1 and K2, respectively. Here, shown in FIG. 9, the word lines WL1a and WL3a of odd-number rows are connected to the gate electrodes of the MOS transistors Tr1a', Tr3a', Tr1a, and Tr3a of odd-number columns, respectively, the word lines WL2a and WL4a of even-number rows are connected to the gate electrodes of the MOS transistors Tr2a' and Tr2a of even-number columns, respectively. When the word lines WL1a and WL3a of the odd-number rows are driven, sense circuits SAa1 and SAa2 of odd-number columns are activated. When the word lines WL2a and WL4a of even-number rows are driven, a sense circuit SAb1 of an even-number column is activated.

The embodiment will be further described below with reference to the drawings.

As shown in FIG. 7, in this DRAM, the word lines WL1a, WL2a, WL3a, and WL4a and the bit lines BL1a, BL2a, and BL3a which are connected to memory cells are formed. Here, the word lines WL1a, WL2a, WL3a, and WL4a are formed to extend in the row direction, and the bit lines BL1a, BL2a, and BL3a are formed to extend in the column direction. In FIG. 7, the column direction means a vertical direction, and the row direction means a horizontal direction.

Memory cells comprising memory capacitors and MOS transistors are formed at the cross points between the word lines WL1a, WL2a, WL3a, and WL4a and the bit lines BL1a, BL2a, and BL3a.

As shown in FIG. 8, this DRAM comprises a substrate 1 made of p-type silicon monocrystal containing boron at a high concentration and having a resistivity of 0.010 to 0.050 Ω-cm and an epitaxial layer 2 extending in the row direction on one major surface of the substrate 1 and having a resistivity of about 0.5 to 30 Ω-cm and a thickness of 3 to 10 μm. The impurity concentration of the epitaxial layer 2 is more preferably set to the resistivity of the epitaxial layer is, e.g., 1 to 10 Ω-cm.

At a predetermined position above the p-type epitaxial layer 2, gate electrodes 4 and 5 made of polycrystalline silicon or the like containing phosphorus, e.g., are selectively formed through a gate insulating film 3. The gate electrodes 4 and 5 constitute the gates of the MOS transistors Tr1a and Tr2a. The MOS transistor Tr1a has n-type regions 8 and 9 containing an n-type impurity and functioning as a source/drain, and the MOS transistor Tr2a has n-type regions 9 and 10 functioning as a source/drain. The n-type regions 8, 9, and 10 are connected to the bit lines BL1a, BL2a, and BL3a, respectively.

First trenches 6 and 7 each having a width of about 0.1 to 0.3 μm and a depth equal to or larger than the thickness of the p-type epitaxial layer 2 are formed in the epitaxial layer 2 beneath the central portions of the gate electrodes 4 and 5 in a gate length direction (row direction), respectively. By using the first trenches 6 and 7, memory capacitors C1a and C2a are formed.

As shown in FIG. 8, the memory capacitor C1a is formed such that the channel region of the MOS transistor Tr1a having the gate electrode 4 is divided at its center. Therefore, equivalently, as shown in FIG. 9, the MOS transistors Tr11a and Tr12a are arranged on both sides of the memory capacitor C1a. Similarly, on both sides of the memory capacitor C2a, the transistors Tr21a and Tr22a are equivalently arranged.

The gate electrode 4 is a gate electrode shared by the MOS transistors Tr11a and Tr12a and connected to the word line WL3a through a contact K1 as shown in FIGS. 7 and 8. Similarly, the gate electrode 5 is a gate electrode shared by the transistors Tr21a and Tr22a and connected to the word line WL4a through a contact K2.

The bit lines BL1a and BL2a are a pair of bit lines for transmitting a pair of complementary signals representing the same information when the word line WL3a is driven. Similarly, the bit lines BL2a and BL3a are a pair of bit lines for transmitting a pair of complementary signals representing the same information when the word line WL4a is driven.

In this manner, the memory cell according to this embodiment is a two-transistor memory cell in which the drain or source of one of two MOS transistors of one memory cell and the drain or source of the other MOS transistor are connected to each of the pair of bit lines, respectively, to supply the pair of complementary signals representing the same information to a detection circuit (sense amplifier). For this reason, a storing operation can be made reliable, and a stable operation, especially, at a low voltage can be realized.

In the memory cell formed at a cross portion between the bit lines BL1a and BL2a and the word line WL3a and having the memory capacitor C1a, the n-type region 8 serving as the source/drain of the MOS transistor Tr11a and the n-type region 9 serving as the source/drain of the MOS transistor Tr12a are connected to the bit lines BL1a and BL2a through contact K3 and K4, respectively.

An n-type region 12 serving as the drain/source of the MOS transistor Tr11a and an n-type region 12' serving as the drain/source of the MOS transistor Tr12a also function as opposing electrodes in the memory capacitor C1a.

Similarly, in the memory cell formed at a cross portion between the bit lines BL2a and BL3a and the word line WL4a and having the memory capacitor C2a, the n-type region 9 serving as the source/drain of the MOS transistor Tr21a and the n-type region 10 serving as the source/drain of the MOS transistor Tr22a are connected to the bit lines BL2a and BL3a through contact K4 and K5, respectively. In this manner, the n-type region 9 is shared by the MOS transistors Tr12a and Tr21a.

An n-type region 14 serving as the drain/source of the MOS transistor Tr21a and an n-type region 14' serving as the drain/source of the MOS transistor Tr22a also function as opposing electrodes in the memory capacitor C2a.

The memory capacitor C1a is constituted by the n-type regions 12 and 12' formed by diffusing an n-type impurity from the inner wall surface of the first trench 6 formed in the p-type epitaxial layer 2 into the inside of the p-type epitaxial layer 2, a dielectric film 16 formed on the inner surface of the first trench 6, and a conductor 18 buried in the first trench 6. Similarly, the memory capacitor C2a is constituted by the n-type regions 14 and 14' formed by diffusing an n-type impurity from the inner wall surface of the first trench 7 formed in the p-type epitaxial layer 2 into the inside of the p-type epitaxial layer 2, a dielectric film 17 formed on the inner surface of the first trench 7, and a conductor 19 buried in the first trench 7. The conductors 18 and 19, for example, is made of polycrystalline silicon containing an impurity such as phosphorus.

In this manner, the conductor 18 forms a part of the memory capacitor C1a such that the dielectric film 16 is interposed between the n-type regions 12 and 12' on both the sides of the first trench 6, and the conductor 19 forms a part of the memory capacitor C2a such that the dielectric film 17 is interposed between the n-type regions 14 and 14' on both the sides of the first trench 7.

In this manner, in this embodiment, as in the first embodiment, the memory capacitor C1a is formed to divide a semiconductor layer (i.e. channel region) beneath the center of the gate electrode 4 of the MOS transistor Tr1a. For this reason, an area occupied by a MOS transistor and a memory capacitor in each memory cell can be minimized, and the high integration density of DRAM memory cells can be achieved.

As will be described below, the conductor 18 is a floating electrode completely surrounded by the dielectric film 16 or the like, and the conductor 18 is shielded from charges from an external circuit. For this reason, the memory capacitor C1a operates such that the n-type regions 12 and 12' perform as both electrodes of the memory capacitor C1a. Similarly, the conductor 19 is a floating electrode completely surrounded by the dielectric film 17 or the like, and the conductor 19 is shielded from charges from an external circuit. For this reason, the memory capacitor C2a operates such that the n-type regions 14 and 14' perform as both electrodes of the memory capacitor C2a.

In this embodiment, each of the dielectric films 16 and 17 is constituted as a so-called ONO film having a three-layered structure made of a silicon oxide film, a silicon nitride film, and a silicon oxide film. The thickness of the dielectric film is controlled to a converted thickness of about 30 to 120 Å obtained if only silicon oxide film was used.

The p-type epitaxial layer 2 in which the memory capacitors C1a and C2a are formed is divided into belt-like shapes by an element separation structure extending in the row direction same as the extending direction of the word lines WL1a, WL2a, WL3a, and WL4a. More specifically, as shown in FIG. 8, a second trench 22b in the row direction is formed in the p-type epitaxial layer 2. An insulating film 23 made of a silicon oxide film as a main component is coated on the inner surface of the second trench 22b, and a field shield electrode 24 made of a polycrystalline silicon film or the like is buried in the inner space of the second trench 22b. The element separation structure formed in the second trench 22b makes insulating separation between memory cells.

The gate insulating film 3 is interposed between the conductor 18 of the memory capacitor C1a and the gate electrode 4 and between the conductor 19 of the memory capacitor C2a and the gate electrodes 5. The conductors 18 and 19 are entirely surrounded by the dielectric films 16 and 17 and the insulating film 23 in the element separation structure. Therefore, the conductors 18 and 19 serve as floating electrodes which are not conductively coupled to an external circuit.

The potential of the field shield electrode 24 in the element separation structure is set to be almost equal to that of the substrate 1 or fixed to a power supply reference potential (GND) supplied from an external circuit.

The n-type regions 8, 9, and 10 comprise n-type regions 8b, 9b, and 10b containing higher-concentration n-type impurity for making conductive connection preferable, respectively. Contact plugs 25, 26, and 27 consisting of a titanium-silicide alloy, titanium nitride, and the like are formed on the n-type regions 8b, 9b, and 10b, respectively. As will be described below, for example, the n-type regions 8b, 9b, and 10b are formed by a contact phosphorus diffusion method which uses ion injection from the contact plugs 25, 26, and 27. The contact plugs 25, 26, and 27 conductively connect between the n-type regions 8, 9, and 10 and the bit lines BL1a, BL2a, and BL3a extending in the column direction. The bit lines BL1a, BL2a, and BL3a consist of aluminum or the like containing a small amount of copper, e.g.

In the DRAM according to this embodiment, as shown in the equivalent circuit in FIG. 9, sense amplifiers SAa1, SAb1, SAa2, . . . are arranged at one ends of pairs of bit lines connected to memory cells of columns. One bit line is shared as one of a pair of bit lines by the memory cells belonging to memory cell columns adjacent to each other. For example, the bit line BL2a is shared as one of a pair of bit lines by all the memory cells belonging to the memory cell column including the memory capacitor C1a and by all the memory cells belonging to the memory cell column including the memory capacitor C2a.

In the memory cell having the above structure, a pair of complementary signals representing the same information read from the electrodes at both the ends of the memory capacitor C1a are equivalently transmitted to a pair of bit lines, constituted by the bit lines BL1a and BL2a, through the MOS transistors Tr1a and Tr2a, respectively, and are amplified by the sense amplifier SAa1. Since the two-transistor memory cell is used, a stable high-speed operation can be performed even at a low power supply voltage.

Figure 10A:
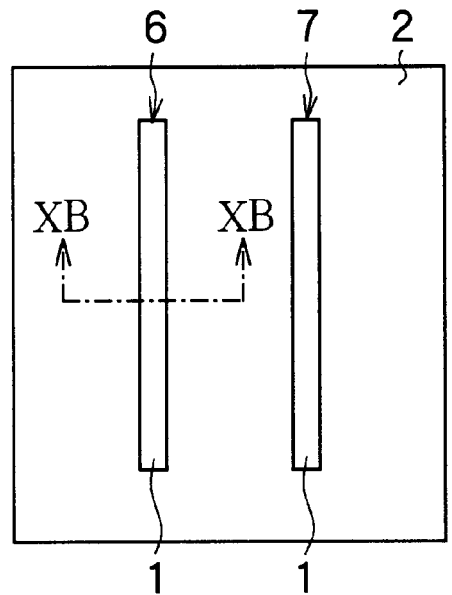
FIG. 10A is a plan view showing a step of manufacturing a DRAM according to the second embodiment of the present invention.
Figure 10B:
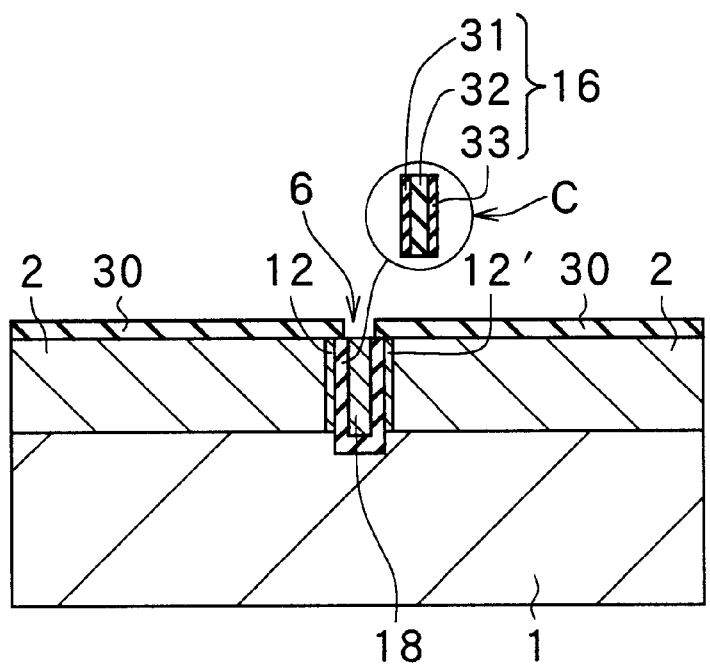
FIG. 10B is a sectional view showing a step of manufacturing a DRAM according to the second embodiment of the present invention.
Figure 11A:
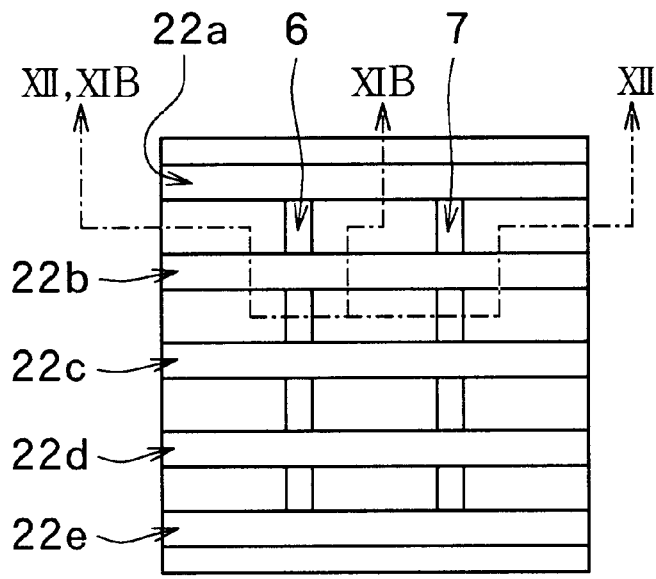
FIG. 11A is a plan view showing the manufacturing step subsequent to FIGS. 10a and 10B.
Figure 11B:
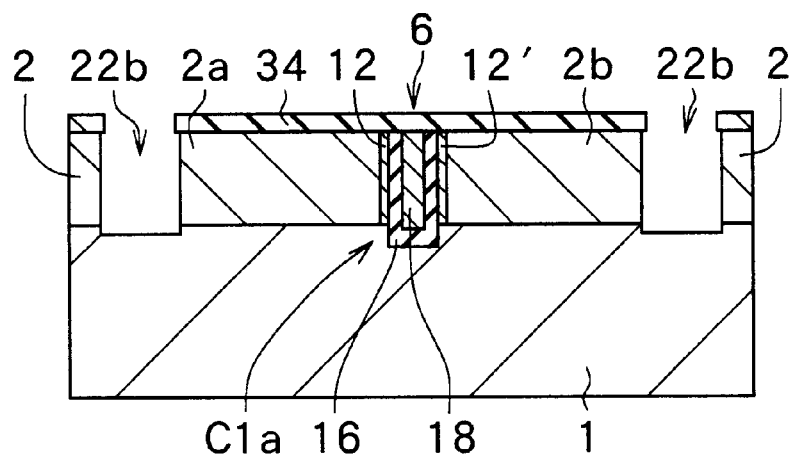
FIG. 11B is a sectional view showing the manufacturing step subsequent to FIGS. 10a and 10B.

A method of manufacturing a DRAM according to this embodiment will be described below with reference to FIGS. 10a to 12C. Here, FIGS. 10a to 12C are views showing a method of manufacturing a DRAM in order of steps. Of these drawings, FIGS. 10a and 11A show plan views in the steps in manufacturing a DRAM, FIG. 10B shows an XB—XB section in FIG. 10A, and FIG. 11B shows an XIB—XIB section in FIG. 11A. FIGS. 12A to 12C show the sections corresponding to an XII—XII section in FIG. 11A after the steps shown in FIGS. 11A and 11B. The same reference numerals as in FIGS. 7 to 9 denote the same elements in the above drawings.

First, as shown in FIGS. 10a and 10B, a low-concentration p-type epitaxial layer 2 having a thickness of about 3 to 16 μm is formed on one major surface of the substrate 1, consisting of p-type silicon monocrystal, in which an impurity is doped at a high concentration. The surface of the epitaxial layer 2 is thermally oxidized to selectively form a silicon oxide film 30 on the surface of the p-type epitaxial layer 2.

The p-type epitaxial layer 2 is selectively etched by using the silicon oxide film 30 as a mask to form the first trenches 6 and 7 extending in the column direction. The first trenches 6 and 7 have such a depth that the first trenches 6 and 7 reach the higher-concentration substrate 1 through the epitaxial layer 2 having a thickness of 3 to 16 μm. The width of the first trenches 6 and 7 is set to be 0.1 to 0.35 μm.

An n-type impurity such as phosphorus or arsenic (As) is doped from the inner surfaces of the first trenches 6 and 7 into the p-type epitaxial layer 2 to form the n-type regions 12, 12' and 14, 14' in the p-type epitaxial layer 2, respectively.

Here, although the bottom surfaces of the first trenches 6 and 7 reach the p-type monocrystalline silicon substrate 1, the substrate 1 contains a p-type impurity at a high concentration. For this reason, the n-type impurity doped from the inner surfaces of the first trenches 6 and 7 does not invert the impurity concentration of the substrate 1. For this reason, regions for forming the n-type regions 12, 12 and 14, 14' do not reach the inside of the substrate 1 and are limited within the p-type epitaxial layer 2. More specifically, the n-type regions 12, 12' and 14, 14' are terminated where the regions reach the substrate 1.

On the inner surfaces of the first trenches 6 and 7, the dielectric films 16 and 17 each having a small thickness of about 30 to 120 Å are formed. The conductors 18 and 19 constituted by a polycrystalline silicon film or the like containing phosphorus, e.g., are buried in the residual spaces in the first trenches 6 and 7.

Each of the dielectric films 16 and 17, as shown in the enlarged view in a circle C in FIG. 10B, is a three-layered structure film comprising a silicon oxide film 31, a silicon nitride film 32, and a silicon oxide film 33.

As shown in FIGS. 11A and 11B, a silicon oxide film 34 serving as an etching mask is formed on the epitaxial layer 2 and the first trenches 6 and 7 by thermal oxidation and a photolithography process and the subsequent dry etching process is performed, thereby forming a plurality of second trenches 22a to 22e extending in the row direction. The depth of the second trenches 22a to 22e is larger than that of the first trenches 6 and 7. Therefore, the first trenches 6 and 7 are completely divided by the second trenches 22a to 22e in the column direction. In FIG. 11A, the silicon oxide film 34 is omitted.

By forming the second trenches 22a to 22e, the n-type regions 12, 12' and 14, 14', the dielectric films 16 and 17, the conductors 18 and 19, and the p-type epitaxial layer 2 are also divided in the column direction. In this manner, the MOS capacitor C1a having a structure in which the n-type regions 12 and 12' on both sides of the first trench 6 oppose to the conductor 18 serving as a floating electrode through the dielectric 16 is formed. Similarly, the MOS capacitor C2a having a structure in which the n-type regions 14 and 14' on both sides of the first trench 7 oppose to the conductor 19 serving as a floating electrode through the dielectric 17 is formed.

As shown in FIG. 12A, the insulating film 23 including a silicon oxide as a main component is formed on the inner surface of the second trench 22b or the like, and the field shield electrode 24 consisting of a polycrystalline silicon film or the like containing phosphorus, e.g., and having conductivity is buried in the residual space of the second trench 22b or the like. In this manner, element separation in the column direction is completed.

The silicon oxide film 34 used as a mask is removed, and a silicon oxide film 35 is formed on the entire surface of the resultant structure for the subsequent steps, as shown in FIG. 12A.

In this manner, as shown in FIG. 12A, a p-type epitaxial layer 2a including the n-type region 12, a p-type epitaxial layer 2b including the n-type regions 12' and 14, and a p-type epitaxial layer 2c including the n-type region 14' are independent of each other by forming the first trenches 6, 7 and the second trenches 22b or the like.

Element separation of the p-type epitaxial layers 2a, 2b, and 2c in the row direction is performed by the first trenches 6 and 7 which have been formed to form the memory capacitors C1a and C2a.

As shown in FIG. 12B, the silicon oxide film 35 on the p-type epitaxial layers 2a, 2b, and 2c is selectively removed, and a thermal oxidation process is performed to form a gate insulating film 3. The gate electrodes 4 and 5 made of polycrystalline silicon or the like containing phosphorus, e.g., are selectively formed on the gate insulating film 3. The gate electrodes 4 and 5 serve as the gate electrodes of the MOS transistors Tr1a and Tr2a, respectively. Subsequently, a cap layer serving as a protective layer is formed on the gate electrodes 4 and 5, and insulating film side-walls are formed on the side surface of a multi-layered structure including the gate insulating film 3, the gate electrode 4, and the cap layer and on the side surface of the multi-layered structure including the gate insulating film 3, the gate electrode 5, and the cap layer.

An n-type impurity is doped in a portion near the surface of the p-type epitaxial layers 2a, 2b, and 2c on both the sides of the multi-layered structures including the gate electrodes 4 and 5 to form low-concentration n-type regions 8a, 9a, and 10a. The memory capacitor C1a is located beneath the central portion of the gate electrode 4 in the gate length direction to divide the channel region beneath the gate electrode 4 of the MOS transistor Tr1a. Similarly, the memory capacitor C2a is located beneath the central portion of the gate electrode 5 in the gate length direction to divide the channel region beneath the gate electrode 5 of the MOS transistor Tr2a.

As shown in FIG. 12C, an insulating film 36 made of boron silicate glass (BSG) or the like is formed, and contact holes 37a to 37c respectively reaching the surfaces of the n-type regions 8a, 9a, and 10a are formed. Thereafter, a high-concentration n-type impurity is ion-injected through the contact holes 37a to 37c to form the high-concentration n-type regions 8b, 9b, and 10b, thereby forming the final n-type regions 8, 9, and 10 each having an LDD structure. Titanium, titanium nitride, and tungsten or the like are sequentially formed on the high-concentration n-type regions 8b, 9b, and 10b to form the contact plugs 25, 26, and 27 to be conductively connected to the bit lines BL1a, BL2a, and BL3a, respectively.

In this manner, as shown in FIG. 12C, the MOS transistor Tr1a including the n-type regions 8 and 9 serving as a source-drain and the gate electrode 4 and the MOS transistor Tr2a including the n-type regions 9 and 10 serving as a source-drain and the gate electrode 5 are formed. The MOS capacitors C1a and C2a dividing a channel region are located below the MOS transistors Tr1a and Tr2a, respectively.

Thereafter, as shown in FIG. 8, the bit lines BL1a, BL2a, and BL3a connected to the n-type regions 8, 9, and 10 through the contact plugs 25, 26, and 27, respectively are formed. An insulating interlayer 38 which covers the bit lines BL1a, BL2a, and BL3a, the word lines WL1a to WL3a connected to the gate electrodes 4 and 5, and the like are formed, thereby completing a DRAM memory cell array according to this embodiment.

As described above, according to the DRAM according to this embodiment, a unit memory cell is equivalently constituted by the two MOS transistors Tr11a and Tr12a (or Tr21a and Tr22a) and the memory capacitor C1a (or C2a) arranged between these MOS transistors. More specifically, one memory cell is constituted by two MOS transistors and one memory capacitor which vertically overlap. For this reason, an area occupied by the unit memory cell is small, and unit memory cells can be integrated at a high density. In addition, since the source-drain of the MOS transistor Tr1a (or Tr2a) of the memory cell supplies a pair of complementary signals representing the same information to a pair of bit lines a stable operation can be performed even at a low power supply voltage. More specifically, a semiconductor integrated circuit in which storing functions are integrated at a high density and which can stably operate even at a low power supply voltage can be realized.

According to the DRAM according to this embodiment, since the same bit line is shared by the memory cells of columns which are adjacent to each other, an integration density can be made higher than that in the first embodiment in the row direction. Since an increase in length of a bit line can be suppressed while increasing an integration density, the parasitic capacitances of the bit lines can be reduced. For this reason, an amount of accumulated charge in the bit line and loss of charge in a sensing operation can be reduced, and a power consumption can be reduced.

Although the present invention has been described above with reference to several embodiments, the present invention is not limited to these embodiments. As needed, constituent parts, materials in steps and conductivity types or the like in each of the embodiments can be variably modified.

For example, as the materials of the dielectric films 106, 107, 16, and 17 serving as constituent elements of a memory capacitor, a silicon oxide film and a silicon nitride film can be singly used or can be used as a multi layer. In addition, a high dielectric material or a ferroelectric material such as tantalum oxide ($Ta_2O_5$) or barium (Ba)—strontium (Sr)—titanium (Ti) can also be used as needed. As the material of the conductors 108, 109, 18, and 19, in addition to polycrystalline silicon, a refractory metal can also be used. Furthermore, as the bit line or the word line, wiring materials such as aluminum, copper, tungsten, titanium, and tantalum or the like can also be singly or compositely used.

The insulating film 23 in the field shield element separation structure for separating the p-type epitaxial layer 2 extending in the row direction is formed as a single layer, or may also be formed as a two-layered structure made of a silicon oxide film and a silicon nitride film or a three-layered structure made of a silicon oxide film, a silicon nitride film, and a silicon oxide film.

This embodiment exemplifies a case wherein a p-type monocrystalline silicon substrate 1 on which the p-type epitaxial layer 2 is formed is used as a semiconductor substrate. However, an SOI (silicon on insulator) substrate having a semiconductor layer on an insulating layer may also be used.

Obviously many modifications and variations of the present invention are possible in the light of the above teaching. It is therefore to be understood that within the scope of the appended claims the invention may be practiced otherwise than as specifically described.

What is claimed is:

1. A semiconductor integrated circuit device comprising:
a plurality of semiconductor layers of one conductivity type formed on one major surface of a substrate to be insulated from each other;
a MOS transistor formed on the semiconductor layer; and
a memory capacitor formed in a first trench formed in the semiconductor layer beneath a gate electrode of the MOS transistor, the memory capacitor having a dielectric film formed inside the first trench, and a conductor surrounded with the dielectric film and held at a floating potential,
wherein said semiconductor layers are insulated from each other by a second trench dug from the surface of the semiconductor layer toward the substrate and a second insulating film is formed in the second trench to cover the inner surface of the second trench, and a second conductor is buried inside the second trench having an inner surface covered with the second insulating film.

2. A semiconductor integrated circuit device according to claim 1 wherein the upper end of the first trench is opposed to the gate electrode of the MOS transistor through an insulating film, and the lower end of the first trench reaches the substrate.

3. A semiconductor integrated circuit device according to claim 1 wherein the memory capacitor further comprises a conductive region which is formed at both side-wall portions of the first trench through the dielectric film to be capacitively coupled with the conductor.

4. A semiconductor integrated circuit device according to claim 3 wherein the conductive region is formed by doping an impurity of a reverse conductivity type to the conductivity type of the semiconductor layer into said semiconductor layer.

5. A semiconductor integrated circuit device according to claim 1 wherein the semiconductor layers are formed almost parallel to each other in one direction to be insulated from each other on the substrate; and
the MOS transistor and the memory capacitor are formed to be aligned in the semiconductor layer.

6. A semiconductor integrated circuit device according to claim 1 wherein the second trench has such a depth that the second trench reaches the substrate from the surface of the semiconductor layer.

7. A semiconductor integrated circuit device according to claim 1 wherein an insulator is also buried in the second trench.

8. A semiconductor integrated circuit device comprising:
a semiconductor layer;
a first trench formed in the semiconductor layer to extend in a first direction;
a second trench formed in the semiconductor layer to extend in a second direction;
a charge accumulation memory capacitor formed to comprise a dielectric film formed to cover the inner surface of the first trench and a first electrode layer buried inside the first trench having an inner surface covered with the dielectric film to be opposed to the semiconductor layer through the dielectric film at a side-wall portion of the first trench;

an element separation field shield structure, for dividing the memory capacitors and the semiconductor layers into a plurality of blocks, formed to comprise an insulating film formed to cover the inner surface of the second trench and a second electrode layer buried inside the second trench having the inner surface covered with the insulating film; and a transistor, for controlling an operation of inputting/outputting charges into/from the memory capacitor located beneath the transistor, formed to comprise a gate structure formed above a memory capacitor in a divided block and a pair of first impurity regions formed in the semiconductor layer on both sides of the gate structure.

9. A semiconductor integrated circuit device according to claim 8 further comprising a second impurity region formed in the semiconductor layer at side-wall portions on both sides of the first trench.

10. A semiconductor integrated circuit device according to claim 8 wherein the gate structure comprises a gate electrode and a gate insulating film, and an upper surface of the first electrode layer of the memory capacitor is coated with the gate insulating film.

11. A semiconductor integrated circuit device according to claim 8 wherein the semiconductor layer comprises a first semiconductor layer of a reverse conductivity type to a conductivity type of the first impurity region; and a second semiconductor layer formed on the first semiconductor layer, and the first trench and the second trench are formed in the second semiconductor layer such that the bottom portions of these trenches reach the first semiconductor layer.

12. A semiconductor integrated circuit device according to claim 11 wherein the plurality of memory capacitors and the plurality of transistors are formed in the second semiconductor layer divided by the field shield element separation structure along the second direction.

13. A semiconductor integrated circuit device according to claim 11 wherein the first semiconductor layer and the second semiconductor layer have a same conductivity type, and a concentration of an impurity contained in the first semiconductor layer is higher than a concentration of an impurity contained in the second semiconductor layer.

14. A semiconductor integrated circuit device according to claim 8 wherein the insulating film comprises a silicon nitride film.

15. A semiconductor integrated circuit device according to claim 8 wherein the insulating film comprises a three-layered structure comprising a silicon oxide film, a silicon nitride film, and a silicon oxide film.

* * * * *